United States Patent
Shin et al.

(10) Patent No.: US 8,791,764 B2
(45) Date of Patent: Jul. 29, 2014

(54) DIGITALLY CONTROLLED OSCILLATOR, AND PHASE LOCKED LOOP (PPL) CIRCUIT INCLUDING THE SAME

(75) Inventors: Jongshin Shin, Yongin-si (KR); JaeHyun Park, Seoul (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 117 days.

(21) Appl. No.: 13/410,355

(22) Filed: Mar. 2, 2012

(65) Prior Publication Data

US 2012/0223778 A1     Sep. 6, 2012

(30) Foreign Application Priority Data

Mar. 3, 2011   (KR) .................. 10-2011-0019023

(51) Int. Cl.
*H03K 3/00*   (2006.01)

(52) U.S. Cl.
USPC .............. 331/57; 327/269; 327/270; 327/156

(58) Field of Classification Search
USPC .............. 331/57; 327/156, 269, 270
See application file for complete search history.

(56) References Cited

U.S. PATENT DOCUMENTS

| | | |
|---|---|---|
| 8,040,196 B2 * | 10/2011 | Shin ........................ 331/57 |
| 2010/0090771 A1 | 4/2010 | Shin |
| 2011/0006851 A1 | 1/2011 | Kim |

FOREIGN PATENT DOCUMENTS

| | | |
|---|---|---|
| JP | 09-261012 | 10/1997 |
| JP | 2008-067368 | 3/2008 |
| KR | 100275329 | 9/2000 |
| KR | 1020010054898 | 7/2001 |
| KR | 1020100040221 | 4/2010 |
| KR | 1020110005056 | 1/2011 |

OTHER PUBLICATIONS

Nasser Erfani Majd, Mojtaba Lotfizad, "A Novel Low Power Digitally Controlled Oscillator with Improved Linear Operating Range", World Academy of Science, Engineering and Technology 75 2011, p. 1268-1273.

* cited by examiner

*Primary Examiner* — Arnold Kinkead
(74) *Attorney, Agent, or Firm* — F. Chau & Associates, LLC

(57) ABSTRACT

Disclosed is a digitally controlled oscillator which includes a ring oscillator; and a variable resistance bank connected between one power node of the ring oscillator and a power supply terminal and having the resistance value varied according to the number of active bits of a control code. The frequency of an clock signal output by the ring oscillator is changed non-linearly according to the resistance value of the variable resistance bank. The frequency of the output clock signal is changed stepwise linearly according to the number of active bits of the control code.

16 Claims, 9 Drawing Sheets

Fig. 5

Control Code(CC)

| CC[n-1] | ... | CC[2] | CC[1] | CC[0] |
|---------|-----|-------|-------|-------|
| 0 |  | 0 | 0 | 0 |
| 0 |  | 0 | 0 | 1 |
| 0 |  | 0 | 1 | 1 |
| 0 |  | 1 | 1 | 1 |
|  | ... |  |  |  |
| 1 |  | 1 | 1 | 1 |

DIGITALLY CONTROLLED OSCILLATOR, AND PHASE LOCKED LOOP (PPL) CIRCUIT INCLUDING THE SAME

CROSS-REFERENCE TO RELATED APPLICATIONS

This application claims the benefits, under 35 U.S.C §119, of Korean Patent Application No. 10-2011-0019023 filed Mar. 3, 2011, the entirety of which is incorporated by reference herein.

TECHNICAL FIELD

Exemplary embodiments relate to a digitally controlled oscillator, and more particularly, relate to a device of linearizing an output clock signal of a digitally controlled oscillator.

DISCUSSION OF THE RELATED ART

A phase locked loop (PLL) circuit is used as an intellectual property block of a integrated circuit (IC) to be designed, and provides a clock signal to systems formed on the IC for various purposes. Accordingly, the PLL circuit having a wide operating range is needed. Since operating at a lower supply voltage is desired for a high integration, a digital PLL circuit has been researched as a device for replacing an analog PLL circuit in highly integrated circuits.

The operating range of the digital PLL circuit may be controlled by a digitally controlled oscillator (DCO) included within the digital PLL circuit. The DCO controls the frequency tuning range and the phase noise performance, of constituent elements within the digital PLL circuit.

The DCO consists of a delay line which has an odd number of series-connected inverters (stages of the delay line). The DCO generates an oscillation signal by feeding back a delayed signal output from the delay line to an input terminal of the delay line. The phase and the frequency of the oscillation signal are adjusted by controlling the delay time according to a digital control signal.

SUMMARY

One aspect of the inventive concept is directed to provide a digitally controlled oscillator which comprises a ring oscillator; and a first variable resistance bank connected with one power node of the ring oscillator and having its resistance value varied according to the number of active bits of a control code. The frequency of the output clock signal of the ring oscillator is changed according to the resistance value of the variable resistance bank, and the frequency of the output clock signal of the ring oscillator is changed linearly according to the number of active bits of the control code.

In various exemplary embodiments, the relationship between the control code and the reciprocal of the resistance value of a variable resistance bank is defined by a first function and the relationship between the reciprocal of the resistance value of the variable resistance bank and the frequency of the output clock signal is defined by a second function. The resistance value of the variable resistance bank may be changed such that the first function becomes a reciprocal function of the second function.

In various exemplary embodiments, the variable resistance bank includes a plurality of switches (e.g., transistors) connected in parallel to the power node of the ring oscillator. A transistor having an ON-resistance may implement each ON/OFF switch (having only two states) and may be formed as either a PMOS or an NMOS transistor.

In various exemplary embodiments, each of the plurality of switches (e.g., transistors) is turned ON or OFF under the control of corresponding bits of the control code applied to the control gates of the switches, respectively, and each switch has a different ON-resistance than the others.

In various exemplary embodiments, the resistance value of a (n-2)th transistor is larger than that of an (n-1)th transistor.

In some exemplary embodiments the plurality of switches are formed of N transistors, and the channel width of the (n-2)th transistor is narrower than that of the (n-1)th transistor, or the channel length of the (n-2)th transistor is longer than that of the (n-1)th transistor.

In some embodiments, the variable resistance bank is connected between the high voltage power node of the ring oscillator and a high power supply voltage terminal.

In other embodiments, the variable resistance bank is connected between the low voltage power node of the ring oscillator and a ground voltage terminal.

The digitally controlled oscillator may further comprise a second variable resistance bank connected with another power node of the ring oscillator and having the resistance value varied according to the number $\Delta CC0$ of active bits of a control code.

In some embodiments, the second variable resistance bank is formed of N transistors which are controlled (ON/OFF) sequentially according to the control code.

In various embodiments, when a state of an (n-1)th transistor is changed, states of first to (n-2)th transistors are maintained.

Another aspect of the inventive concept is directed to provide a digitally controlled oscillator which comprises a ring oscillator; and a first variable resistance bank formed of a plurality of transistors each turned ON or OFF according to the bits of a control code, wherein an output frequency of the ring oscillator increases linearly when the total resistance value of the variable resistance bank increases according to states of the plurality of transistors, and wherein the output frequency of the ring oscillator decreases linearly when the total resistance value of the variable resistance bank decreases according to states of the plurality of transistors.

In various exemplary embodiments, when the relationship between the control code and a reciprocal of the total resistance value is defined by a first function and the relationship between the reciprocal of the total resistance value and the output frequency is defined by a second function. The first function may be preferably a reciprocal function of the second function.

In a first exemplary embodiment, the first variable resistance bank is connected between one power node of the ring oscillator and a power supply voltage terminal, and the value of a reciprocal of its total resistance value increases when the number of active bits of the control code increases and decreases when the number of active bits of the control code decreases.

In various other embodiments, a second variable resistance bank is connected between one power node of the ring oscillator and a ground voltage terminal, and the value of a reciprocal of its total resistance value decreases when a value of the control code increases and increases when a value of the control code decreases.

The inventive concept is described more fully hereinafter with reference to the accompanying drawings, in which exemplary embodiments of the inventive concept are shown. This inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. As used herein, the term "and/or" includes any and all combinations of one or more of the associated listed items.

It will be understood that when an element or layer is referred to as being "connected to", or "coupled to", another element, it can be directly connected, or coupled to the other element, or intervening elements may be present. In contrast, when an element is referred to as being "directly connected to", or "directly coupled to", another element, there are no intervening elements.

BRIEF DESCRIPTION OF THE FIGURES

The above and other features will become apparent from the following description with reference to the following figures, wherein like reference numerals refer to like parts throughout the various figures unless otherwise specified, and wherein:

FIG. 5 is a table showing a control code for controlling the resistance value of the variable resistance bank of FIG. 4:

DETAILED DESCRIPTION

Figure 1:
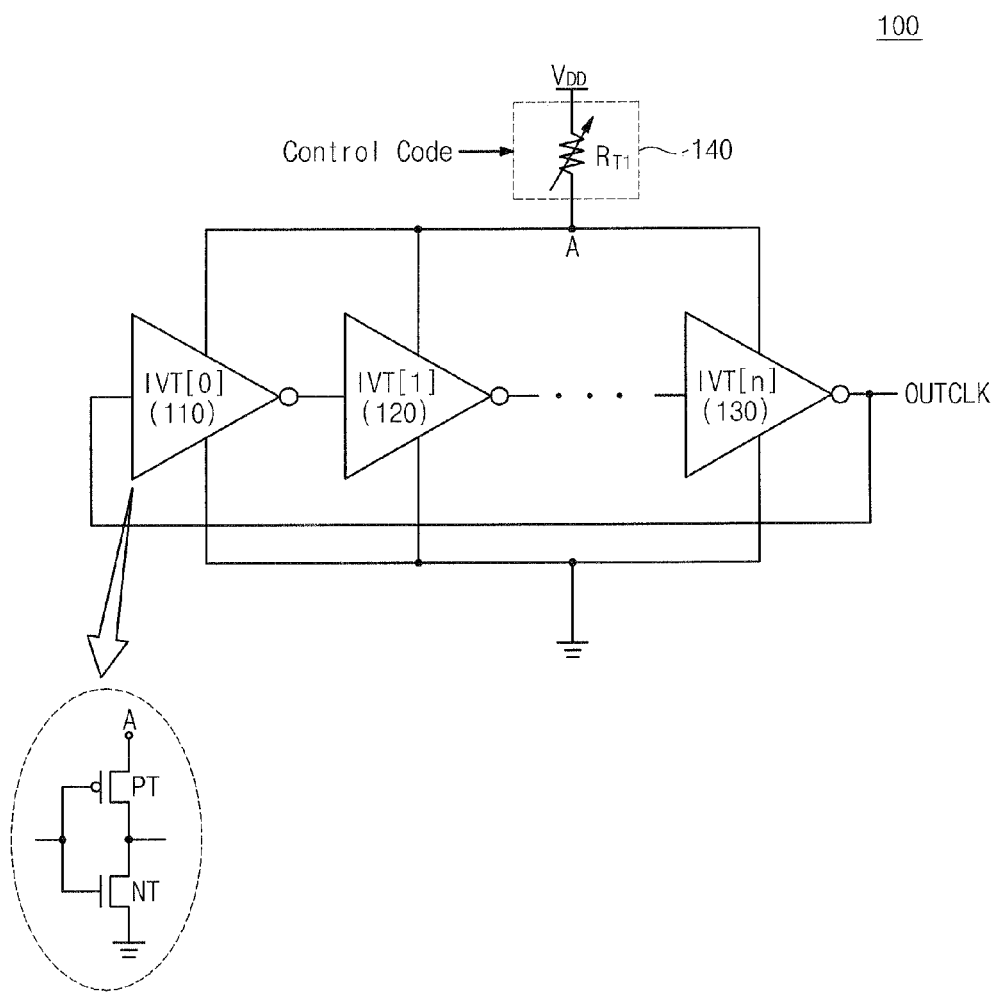
FIG. 1 is a block diagram of a digitally controlled oscillator according to an exemplary embodiment of the inventive concept.
Figure 2:
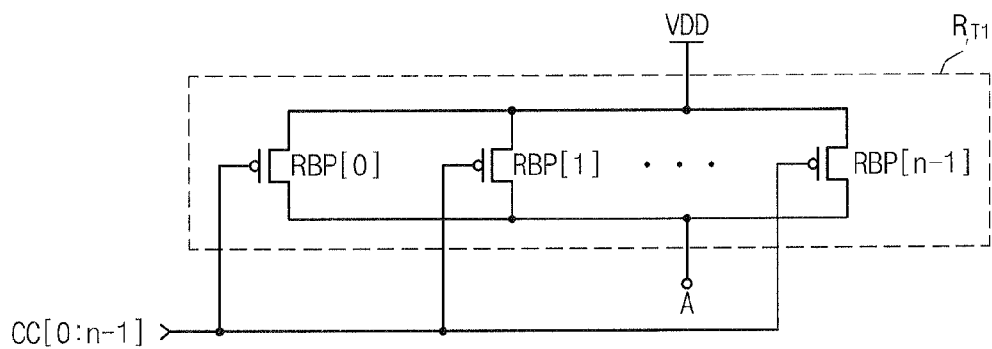
FIG. 2 is a circuit diagram of a variable resistance bank in FIG. 1.

FIG. 1 is a block diagram of a digitally controlled oscillator according to an embodiment of the inventive concept. FIG. 2 is a circuit diagram of the variable resistance bank 140 in FIG. 1. The digitally controlled oscillator 100 may be used to perform an automatic frequency calibration (AFC) function of a phase locked loop circuit or provide a voltage controlled oscillator having a wide operating range.

The digitally controlled oscillator 100 includes a ring oscillator comprised of an odd number of delay inverters (hereinafter, called an inverter) 110 to 130. The digitally controlled oscillator 100 further comprises a variable resistance bank 140 comprising a plurality of parallel-connected transistors. The variable resistance bank 140 is connected with a node A being a power supply voltage terminal of each of the inverters 110 to 130.

Figure 4:
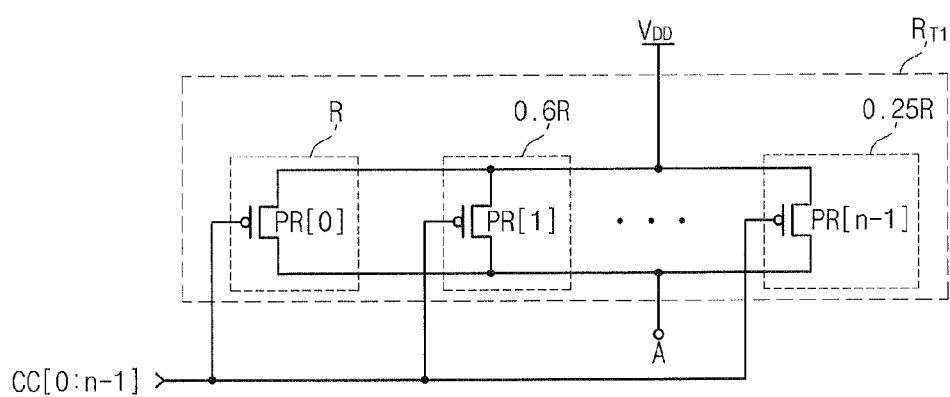
FIG. 4 is a circuit diagram of the variable resistance bank of FIG. 2 in which different weights are applied to each of the transistors.

The variable resistance bank 140 may be formed of transistors having the same or different resistance values (as explicitly shown in FIG. 4). The transistors of the variable resistance bank 140 may be individually controlled according to a control code. The digitally controlled oscillator 100 is configured such that the total resistance value $R_{T1}$ of the variable resistance bank 140 is controlled according to the control code. The digitally controlled oscillator 100 generates an output clock signal OUTCLK having a frequency corresponding to the total resistance value $R_{T1}$.

Because the inverters 110 to 130 connected with the variable resistance bank 140, are CMOS resistor-based inverters the digitally controlled oscillator 100 may consume only slight power when the delay time becomes long. The digitally controlled oscillator 100 may control the total resistance value $R_{T1}$ of the variable resistance bank 140 by the control code without independently controlling delay cells. Thus, the frequency of the output clock signal OUTCLK is adjusted by the control code.

Referring to FIG. 2, the variable resistance bank 140 includes a plurality of PMOS transistors RBP[0] to RBP[n-1] that are controlled by the control code CC[0:n-1]. In a first exemplary embodiment, the PMOS transistor RBP[0] to RBP[n-1] of the variable resistance bank 140 may be designed to all have the same resistance value. Herein, the number n of bits of n-bit the control code CC[0:n-1] may be the same as the number of output frequencies of the digitally controlled oscillator 100 (or, the same as number of output frequencies generated by the digitally controlled oscillator 100). For example, if the output clock signal OUTCLK of the digitally controlled oscillator 100 has three frequencies, the control code CC[0:n-1] may be formed of three bits (i.e., n=3). This means that the number of transistors included within the variable resistance bank 140 is the same as the number of output frequencies of the digitally controlled oscillator 100.

Alternatively, when driven by the n-bit control code CC[0:n-1], the PMOS transistor RBP[0] to RBP[n-1] of the variable resistance bank 140 may be designed to have different resistance values from one another. A method of designing the transistors to have different resistance values will be more fully described with reference to FIG. 4. The PMOS transistor RBP[0] to RBP[n-1] of the variable resistance bank 140 are driven according to the n-bit control code CC[0:n-1] to control the total resistance value $R_{T1}$ of the variable resistance bank 140. The transconductance Gm of a PMOS transistor PT in the respective inverters 110 to 130 may be adjusted by the total resistance value $R_{T1}$ of the variable resistance bank 140. The transconductance Gm may be one of factors controlling an output frequency of the digitally controlled oscillator 100.

In FIG. 2, there is exemplarily illustrated the variable resistance bank 140 in which a plurality of PMOS transistors are connected in parallel with the node A. But, the inventive concept is not limited thereto. For example, the variable resistance bank 140 can be formed of a plurality of PMOS transistors series-connected or parallel-connected with the node A or a plurality of NMOS transistors series-connected with the node A.

Figure 3:
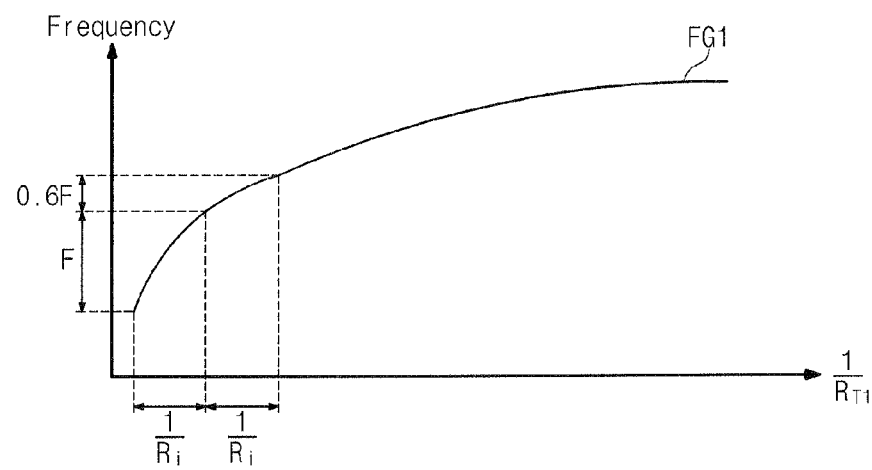
FIG. 3 is a graph showing the relationship between the resistance value of the variable resistance bank of FIG. 2 and the frequency of an output clock signal of the digitally controlled oscillator of FIG. 1.

FIG. 3 is a graph showing the relationship between the resistance value of the variable resistance bank of FIG. 2 and the frequency of an output clock signal of the digitally controlled oscillator of FIG. 1. In FIG. 3, a characteristic curve FG1 indicates the frequency characteristic of the digitally controlled oscillator 100 of FIG. 1 which non-linearly varies according to the reciprocal ($1/R_{T1}$) of the total resistance value $R_{T1}$ of the variable resistance bank 140 in FIG. 1. Thus, when the value of the reciprocal $1/R_{T1}$ of the total resistance value of the variable resistance bank 140 varies, the frequency of an output clock signal does not vary linearly. As illustrated in the graph of FIG. 3, when the value of the reciprocal of the total resistance value increases incrementally by increments 1/Ri, the change ΔF of the frequency gradually decreases (e.g., from 1 unit F to 0.6 F) per increment of 1/Ri.

In a case where the resistance value of the variable resistance bank 140 varies in the above-described manner, the digitally controlled oscillator 100 in FIG. 1 may have a wide operating range, thus, a wide frequency range. If the total resistance value $R_{T1}$ of the variable resistance bank 140 is changed linearly, the frequency of an output clock signal of the digitally controlled oscillator 100 changes non-linearly.

In accordance with the inventive concept, the total resistance value $R_{T1}$ of the variable resistance bank 140 is adjusted non-linearly (increased or decreased constantly) such that the frequency of an output clock signal of the digitally controlled oscillator 100 is varied linearly. For this result, the variable resistance bank 140 may be configured such that resistance values of transistors therein are different from one another, for example, the transistors thereof have different weights from one another. This will be more fully described with reference to FIG. 4.

FIG. 4 is a circuit diagram of variable resistance bank in FIG. 2 in which different weights are applied to transistors. Transistors PR[0] to PR[n-1] of a variable resistance bank 140 may have different resistance values according to each transistor's size, for example, a channel width or length. For example, if a transistor has a relatively narrow channel width, its resistance value may be relatively large. If a transistor has a relatively wide channel width, its resistance value may be relatively small. The relative sizes of transistors formed in the same integrated circuit may be characterized based on the ratio of its channel width divided by its length.

In FIG. 4, exemplary resistance values of the transistors PR[0] to PR[n-1] are illustrated for ease of description. But, it is well understood that resistance values of the transistors PR[0] to PR[n-1] can be determined considering the relationship between a control code and the frequency of an output clock signal OUTCLK of a digitally controlled oscillator 100.

Referring to FIG. 4, the resistance value R of a transistor PR[0] controlled by the least significant bit CC[0] of the control code may be designed to be larger than that 0.25 R resistance of a transistor PR[n-1] controlled by the most significant bit CC[n-1] thereof. Herein, the resistance value R may indicate a unit resistance value.

As understood from a graph in FIG. 3, to increase the frequency change linearly with increasing bits of the control code, the reciprocal $1/R_{T1}$ of a total resistance value of the variable resistance bank 140 may be varied to be increased gradually, not varied constantly. The reciprocal $1/R_{T1}$ of the total resistance value of the variable resistance bank 140 may be varied to be increased gradually by controlling the total resistance value $R_{T1}$ of the variable resistance bank 140 to be decreased gradually. A gradual decrease in the total resistance value $R_{T1}$ of the variable resistance bank 140 may be achieved by designing a transistor PR[0] controlled by the LSB CC[0] of the control code so as to have a larger resistance as compared with a transistor PR[n-1] controlled by the MSB CC[n-1] thereof. In this case, transistors PR[0] to PR[n-1] may be turned ON sequentially according to the sequence of n bits of the control code CC[0:n-1].

FIG. 5 is a table showing a control code for controlling the total resistance value of the variable resistance bank of FIG. 4. As described above, a control code CC for controlling the total resistance value $R_{T1}$ of the variable resistance bank 140 of FIG. 1 may be applied such that transistors PR[0] to PR[n-1] are turned ON sequentially (i.e., in order of increasing bit position). Further, the control code CC may be applied such that each ON transistor continues to maintain a ON state. Thus, the control code CC may be applied such that the total resistance value is not affected by changing (turning OFF) of a transistor previously turned ON.

Referring to FIG. 5, for example, bits of the control code CC are set to '1' sequentially from the LSB CC[0] to the MSB CC[n-1]. Further, when an upper bit of the control code CC is set to '1', a lower bit is continuously maintained with a set value of '1'. For example, when a third bit value CC[2] of the control code CC is changed from data '0' to data '1', lower bits CC[0] and CC[1] continue to maintain data '1'.

Figure 6:
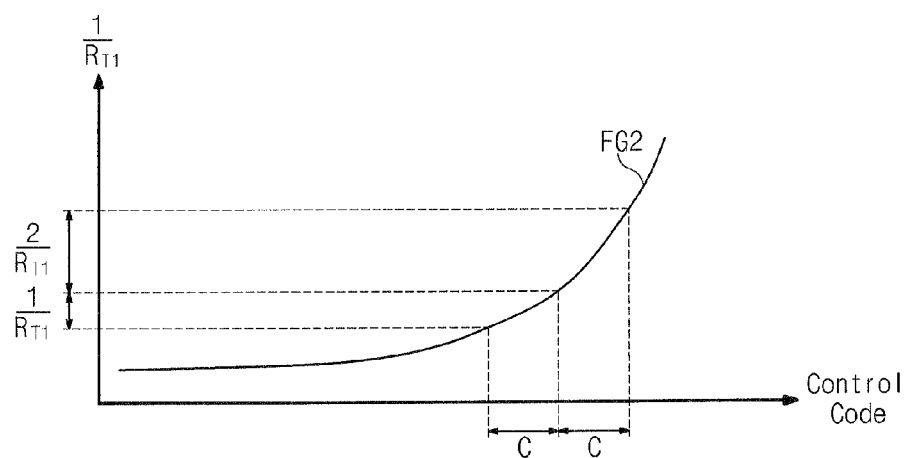
FIG. 6 is a graph showing the relationship between a control code and the resistance value of the variable resistance bank of FIG. 4 in which weights are applied to transistors.

FIG. 6 is a graph showing the relationship between a control code and the resistance value of the variable resistance bank of FIG. 4 in which weights are applied to transistors.

In FIG. 6, a characteristic curve FG2 indicates the relationship between a control code CC and the reciprocal of the total resistance value of the variable resistance bank 140 when transistors PR[0] to PR[n-1] of the variable resistance bank 140 are controlled by the control code CC. Referring to the characteristic curve FG2, when the value of the control code increases by a constant value C (e.g., where C represents changing one bit of the control code), the value of the reciprocal $1/R_{T1}$ of the total resistance value is increased, and is not varied linearly. The positional bits of the control code can be generated using various known methods, including a two directional shift register having a tap for each bit of the control code, or a bit string generator such as a dictionary circuit or a count-indexed look-up table.

Figure 7:
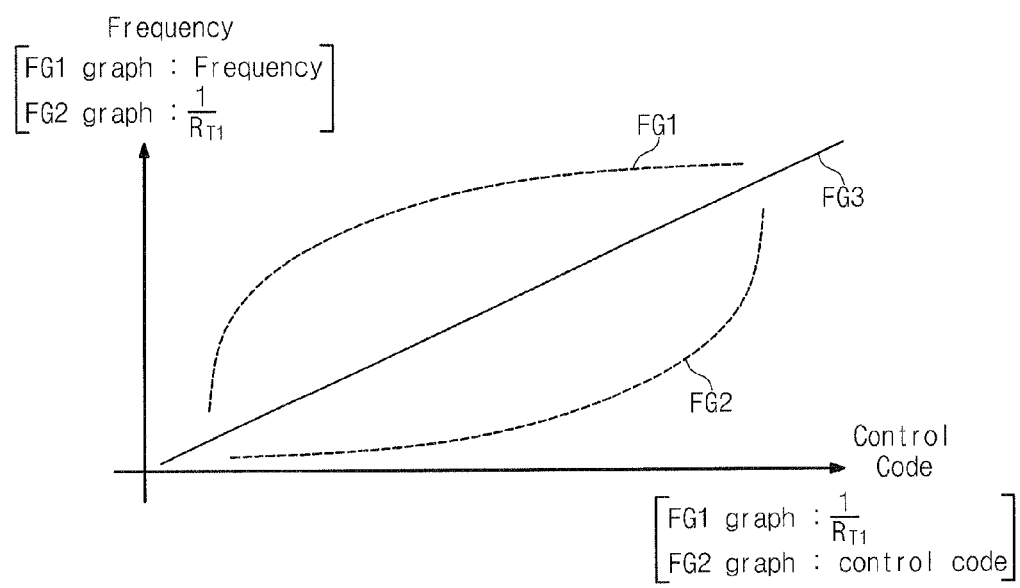
FIG. 7 is a graph showing the frequency characteristic of an output clock signal of the digitally controlled oscillator of FIG. 1.

FIG. 7 is a graph showing the frequency characteristic of a clock signal output by a digitally controlled oscillator according to the first embodiment of the inventive concept. In FIG. 7, the curve FG1 corresponds to a characteristic curve FG1 in FIG. 3, and the curve FG2 corresponds to the characteristic curve FG2 in FIG. 6. The curve FG3 indicates the linear increase of the frequency of an output clock signal of a digitally controlled oscillator 100 with a linear increase of the control code, according to the first embodiment of the inventive concept. In this embodiment, as illustrated in FIG. 5, the control code uses binary (two symbols, e.g., 0, 1) positional notation, but is not precisely a base-2 system with a radix of 2. Each position of the control code represents a weight (i.e., a resistance value) of a corresponding transistor of a resistance bank. As illustrated in FIGS. 6 and 7, the weight (resistance increment) of each position of the control code does not increase linearly nor exponentially with each stepwise increase (increment ΔCC; e.g., ΔCC is expressed in units C in FIG. 6, and C may represent the change of each one bit of the control code) of the control code. In a base-2 binary system, the value of each position increases as exponentially with a power of 2 (e.g., 1, 2, 4, 8, 16 . . . ). In the control code of the present embodiment, the weight of each position of the control code is adapted to result in a stepwise linear increase (ΔF) of the frequency for every increase of the number of active (e.g., 1) bits of the control code starting from CC=zero (ΔCC0; where ΔCC0=1, 2, 3, 4, 5 etc.). Thus, ΔCC0 represents the number of active adjacent bits of the control code including the first (0-th) bit. Thus, ΔF is substantially proportional to ΔCC0 over a linear operating range of the digitally controlled oscillator of FIG. 1. But, the value of each resistance of each corresponding transistor of a resistance bank does not necessarily change exponentially by a power of 2 (e.g., 1, 2, 4, 8, 16 . . . ) for every stepwise increase (increment ΔCC; where ΔCC=1, 2, 3, 4, 5 etc.) of the number of active (e.g., 1) bits of the control code.

It is assumed that the relationship between the control code and the reciprocal $1/R_{T1}$ of the total resistance value is defined as a first function. At this time, the graph of the first function may be identical to the characteristic curve FG2 in FIG. 7. Further, it is assumed that the relationship between the reciprocal $1/R_{T1}$ of the total resistance value and the frequency is defined as a second function. At this time, the graph of the second function may be identical to the characteristic curve FG1 in FIG. 7. In accordance with the first embodiment of the inventive concept, the total resistance value $R_{T1}$ of the variable resistance bank 140 is controlled such that the first function becomes the reciprocal function of the second function.

According to an exemplary embodiment of the inventive concept, when the value of the reciprocal $1/R_{T1}$ of the total resistance value of the variable resistance bank 140 increases non-linearly, the frequency of a clock signal OUTCLK output by the digitally controlled oscillator 100 increases linearly. Likewise, when the value of the reciprocal $1/R_{T1}$ of the total resistance value of the variable resistance bank 140 decreases non-linearly, the frequency of an output clock signal OUTCLK of the digitally controlled oscillator 100 decreases linearly.

Figure 8:
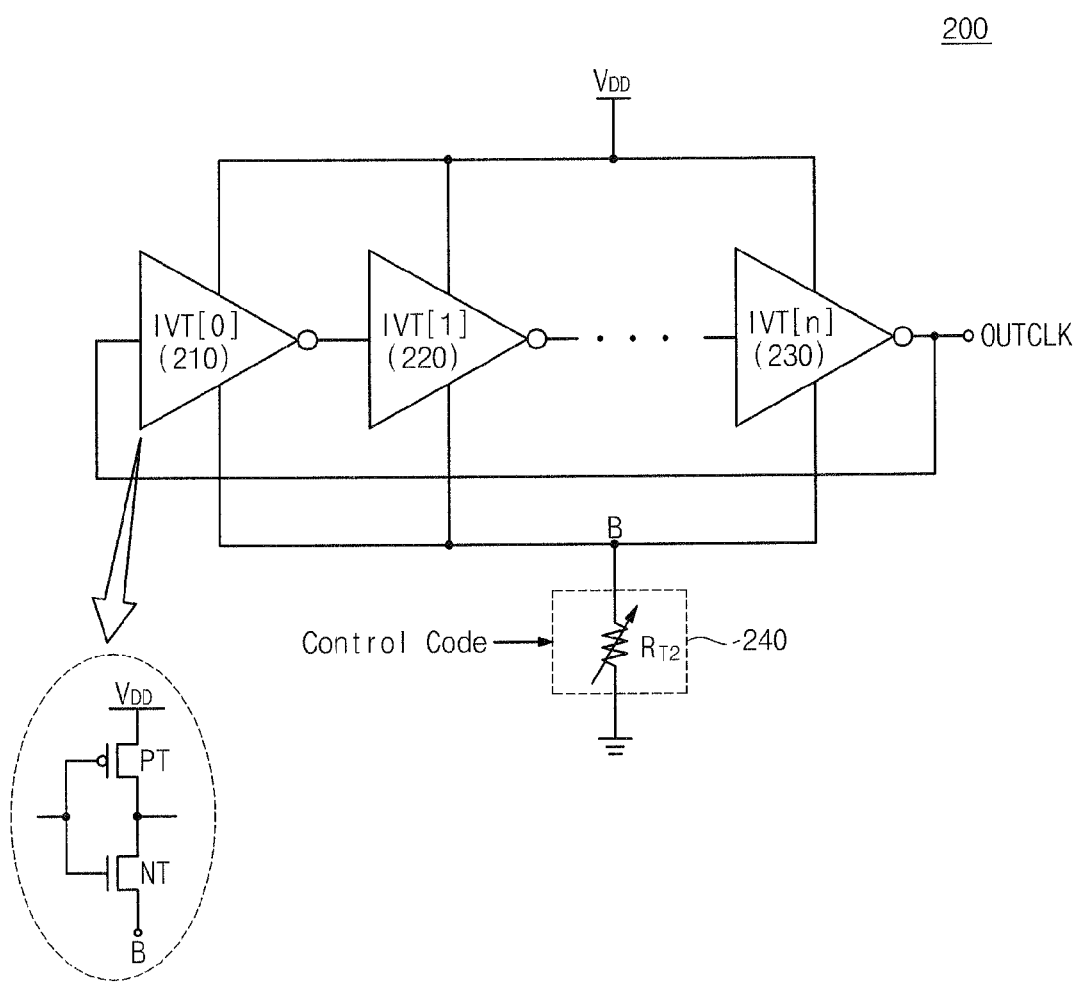
FIG. 8 is a block diagram of a digitally controlled oscillator according to an exemplary embodiment of the inventive concept.
Figure 9:
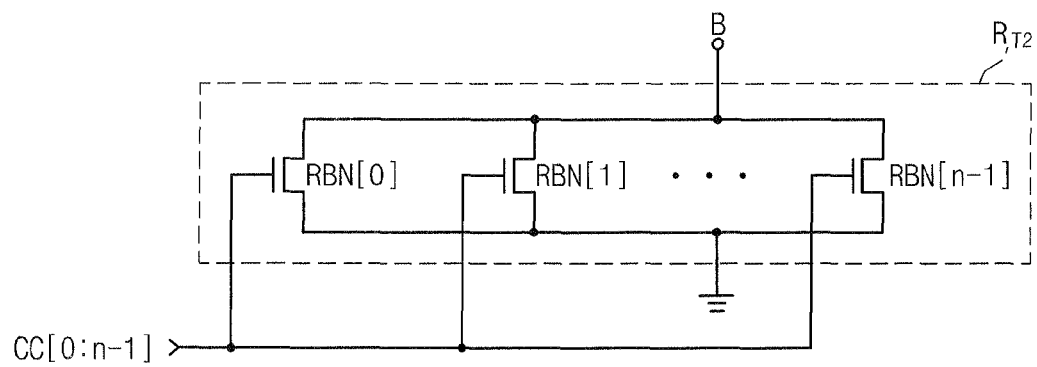
FIG. 9 is a circuit diagram of the variable resistance bank in FIG. 8.

FIG. 8 is a block diagram of a digitally controlled oscillator 200 according to an exemplary embodiment of the inventive concept. FIG. 9 is a circuit diagram of the variable resistance bank 240 in FIG. 8. The digitally controlled oscillator 200 according to the second exemplary embodiment of the inventive concept may include inverters 210 to 230 and a variable resistance bank 240. The variable resistance bank 240 is connected with a node B being a ground voltage terminal of each of the inverters 210 to 230.

The variable resistance bank 240 is formed of transistors having different resistance values and that are independently controlled according to a respective bit of the control code. The digitally controlled oscillator 200 is configured such that the total resistance value $R_{T2}$ of the variable resistance bank 240 is controlled according to the control code, and generates an output clock signal OUTCLK having a frequency corresponding to the total resistance value $R_{T2}$.

When driven by the control code CC[0:n-1], NMOS transistors RBN[0] to RBN[n-1] of the variable resistance bank 240 may be designed to have different resistance values from one another. The NMOS transistors RBN[0] to RBN[n-1] of the variable resistance bank 240 are driven by each bit of the n-bit control code CC[0:n-1], so that the total resistance value $R_{T2}$ of the variable resistance bank 240 is selected. Transconductance Gm of an NMOS transistor NT in the respective inverters 210 to 230 may be adjusted by the total resistance value $R_{T2}$ of the variable resistance bank 240. The transconductance Gm may be one of factors controlling the output frequency of the digitally controlled oscillator 200.

It is assumed that the relationship between a control code and the reciprocal $1/R_{T2}$ of a total resistance value is defined as a first function. A graph of the first function may be identical to the characteristic curve FG1 in FIG. 7. Further, it is assumed that the relationship between the reciprocal $1/R_{T2}$ of the total resistance value and the frequency is defined as a second function. At this time, a graph of the second function may be identical to the characteristic curve FG2 in FIG. 1. In accordance with at least one exemplary embodiment of the inventive concept, the total resistance value $R_{T2}$ of the variable resistance bank 240 is controlled such that the first function becomes a reciprocal function of the second function.

In accordance with at least one exemplary embodiment of the inventive concept, the reciprocal $1/R_{T2}$ of the variable resistance bank 240 is changed non-linearly according to a control code. Accordingly, the frequency of an output clock signal OUTCLK of the digitally controlled oscillator 200 is changed linearly.

Figure 10:
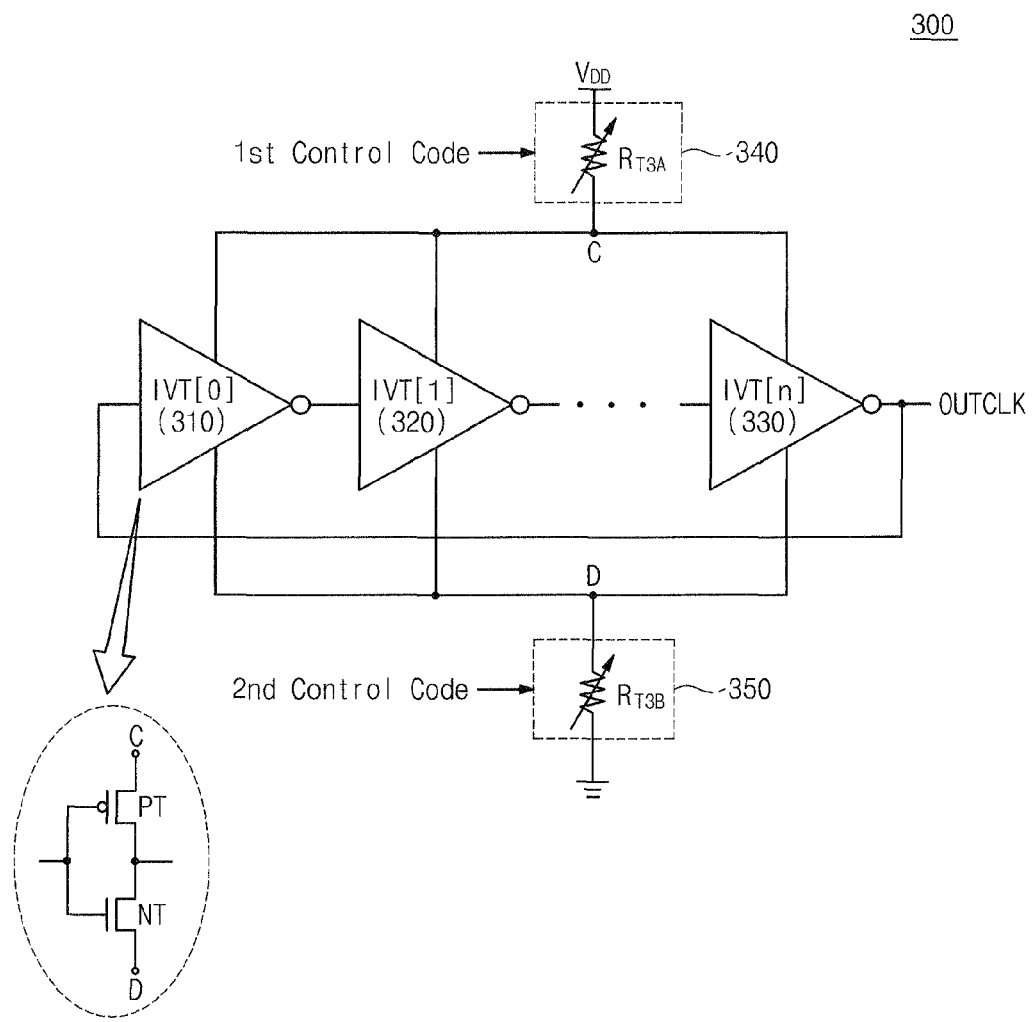
FIG. 10 is a block diagram of a digitally controlled oscillator according to an exemplary embodiment of the inventive concept.

FIG. 10 is a block diagram of a digitally controlled oscillator according to another exemplary embodiment of the inventive concept.

A digitally controlled oscillator 300 according to the third exemplary embodiment of the inventive concept includes cascaded inverters 310 to 330, a first variable resistance bank 340, and a second variable resistance bank 350. The first variable resistance bank 340 is connected to a power node C, and the second variable resistance bank 350 is connected to a power node D. Herein, the node C is a power supply voltage terminal of each of the inverters 310 to 330, and the node D is a ground voltage terminal thereof.

The first variable resistance bank 340 may be configured the same as 140 in FIG. 2, and the second variable resistance bank 350 may be configured the same as 240 in FIG. 9. Therefore, a redundant description of the banks 340 and 350 is omitted.

When the first variable resistance bank 340 is driven by a first control code, the total resistance value $R_{T3A}$ thereof is selected. When the second variable resistance bank 350 is driven by a second control code, the total resistance value $R_{T3B}$ thereof is selected. Transconductance Gmp of a PMOS transistor PT in the respective inverters 310 to 330 may be adjusted by the total resistance value $R_{T3A}$ of the first variable resistance bank 340. Transconductance Gmn of an NMOS transistor NT in the respective inverters 310 to 330 may be adjusted by the total resistance value $R_{T3B}$ of the second variable resistance bank 350. The transconductances Gmp and Gmn may be factors controlling the frequency of clock signal output by the digitally controlled oscillator 300.

It is assumed that the relationship between a control code and the reciprocal $1/R_{T3A}$ of the total resistance value of the first variable resistance bank 340 is defined as a first function. It is assumed that the relationship between a control code and the reciprocal $1/R_{T3A}$ of the total resistance value is defined as a second function. In accordance with this exemplary embodiment of the inventive concept, the total resistance value $R_{T3A}$ of the first variable resistance bank 340 is controlled such that the first function becomes a reciprocal function of the second function. It is assumed that the relationship between a control code and the reciprocal $1/R_{T3B}$ of the total resistance value of the second variable resistance bank 350 is defined as a third function. It is assumed that the relationship between a control code and the reciprocal $1/R_{T3B}$ of the total resistance value is defined as a fourth function. In accordance with this exemplary embodiment of the inventive concept, the total resistance value $R_{T3B}$ of the second variable resistance bank 350 is controlled such that the third function becomes a reciprocal function of the fourth function.

In accordance with another exemplary embodiment of the inventive concept, values of the reciprocals $1/R_{T3A}$ and $1/R_{T3B}$ of the variable resistance banks 340 and 350 are changed non-linearly according to each increment of the control codes. Accordingly, the frequency of an output clock signal OUTCLK of the digitally controlled oscillator 300 is changed linearly according to each increment of the control codes.

Figure 11:
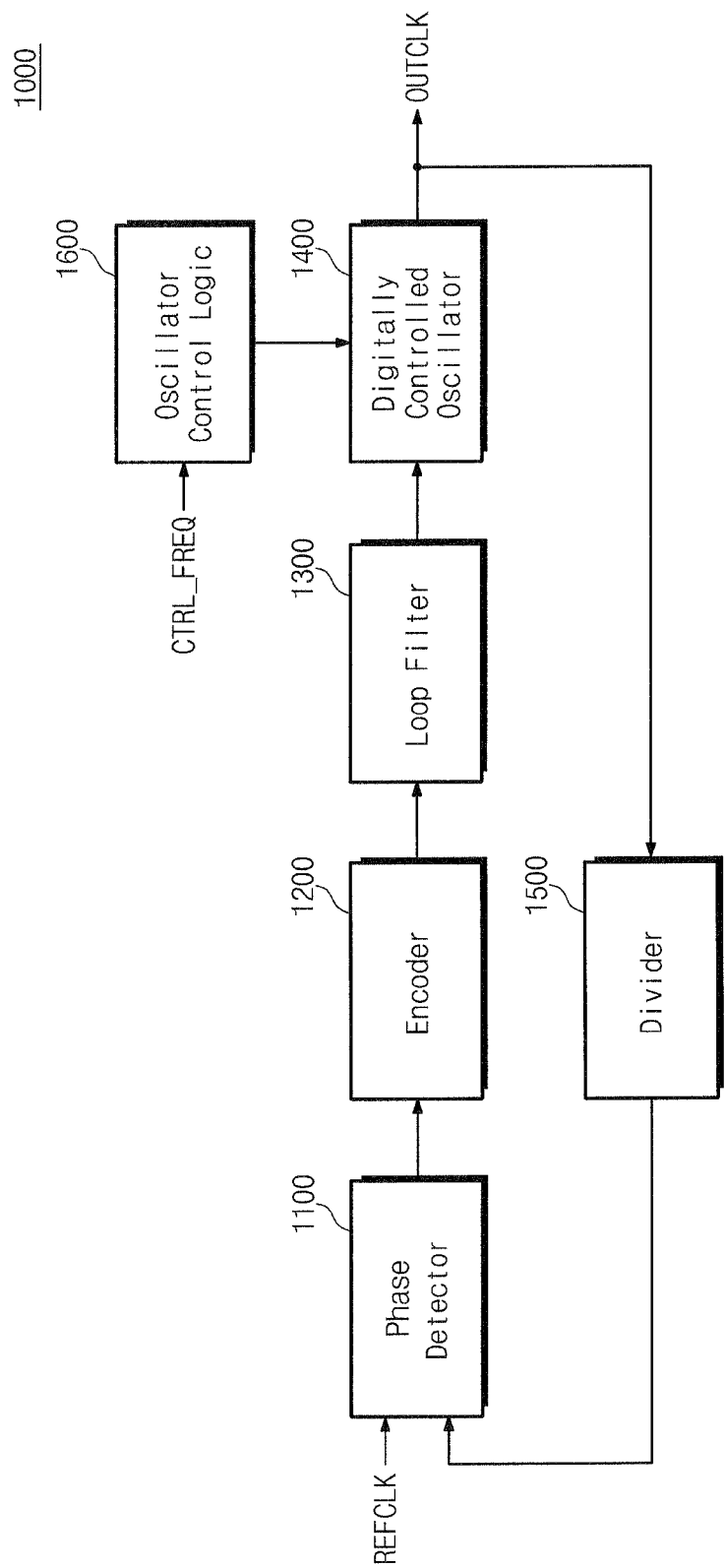
FIG. 11 is a block diagram of a phase locked loop (PLL) circuit including a digitally controlled oscillator according to any exemplary embodiment of the inventive concept.

FIG. 11 is a block diagram of a phase locked loop circuit including a digitally controlled oscillator according to any exemplary embodiment of the inventive concept. In FIG. 11, the phase locked loop circuit 1000 includes at a phase detector 1100 that samples and compares the value of a divider 1500 to detect a phase error value. The phase locked loop circuit 1000 includes a phase detector 1100, an encoder 1200, a loop filter 1300, a digitally controlled oscillator 1400, and oscillator control logic 1600.

The divider 1500 may be configured to divide the clock signal OUTCLK output by the phase locked loop circuit 1000. For example, the output clock signal OUTCLK may be divided by performing a count operation by a predetermined number. An output signal of the divider 1500 is provided to the phase detector 1100. Further, the phase detector 1100 is supplied with a reference clock signal REFCLK.

While the reference clock signal REFCLK is at a high level, the phase detector 1100 samples and stores a count value of the divider 1500 as a phase detection value. The phase detector 1100 provides the phase detection value to the encoder 1200. The encoder 1200 generates a phase error value according to the phase detection value. The phase error value is filtered via the loop filter 1300, and the filtered phase error value is provided to the digitally controlled oscillator 1400.

The digitally controlled oscillator 1400 generates the output clock signal OUTCLK according to the phase error value provided via the loop filter 1300. The oscillator control logic 1600 provides the digitally controlled oscillator 1400 with the control code as described herein above according to an input frequency control signal CTRL_FREQ. The digitally controlled oscillator 1400 adjusts the phase or the frequency of the output clock signal OUTCLK according to the control code from the oscillator control logic 1600. For example, the digitally controlled oscillator 1400 adjusts the phase or the frequency of the output clock signal OUTCLK so as to have a linear characteristic relative to changes in the control code as hereinabove described.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description. In the claims, N is a real number of switches, and n is a real number variable indexing the switches, $\Delta CC0$ is a real number variable counting the active bits of the control code.

What is claimed is:

1. A digitally controlled oscillator comprising:
a ring oscillator having a delay line including a plurality of inverters, wherein each of the inverters is connected between a first delay power supply node and a second delay power supply node; and
a first variable resistance bank connected between the first delay power supply node and a first power supply voltage terminal and having a variable resistance value varied under the control of n bits of a control code,
wherein a frequency of a clock signal output by the ring oscillator is based on the resistance value of the variable resistance bank,
wherein the frequency of the clock signal output by the ring oscillator changes substantially proportional to a number of active bits of the control code, and
wherein a relationship between the number of active bits of the control code and the reciprocal of the resistance value is non-linear and wherein a relationship between the reciprocal of the resistance value and the frequency of the output clock signal is non-linear.

2. A digitally controlled oscillator comprising:
a ring oscillator having a delay line including a plurality of inverters, wherein each of the inverters is connected between a first delay power supply node and a second delay power supply node; and
a first variable resistance bank connected between the first delay power supply node and a first power supply voltage terminal and having a variable resistance value varied under the control of n bits of a control code,
wherein a frequency of a clock signal output by the ring oscillator is based on the resistance value of the variable resistance bank,
wherein the frequency of the clock signal output by the ring oscillator changes substantially proportional to a number of active bits of the control code,
wherein the first variable resistance bank includes a first plurality N of switches connected in parallel between the first power supply voltage terminal and the first delay power supply node,
wherein each switch among the first plurality N of switches is turned ON or OFF by a corresponding bit of the control code, respectively, and wherein each switch among the first plurality N of switches has a different ON-resistance value than the others,
wherein a relationship between the number of active bits of the control code and the reciprocal of the resistance value is non-linear.

3. The digitally controlled oscillator of claim 2,
wherein an ON-resistance value of the (n-2)th switch is larger than that of the (n-1)th switch.

4. The digitally controlled oscillator of claim 3, wherein each switch is formed as a transistor and a channel width of the (n-2)th transistor is narrower than that of the (n-1)th transistor, or a channel length of the (n-2)th transistor is longer than that of the (n-1)th transistor.

5. The digitally controlled oscillator of claim 1, wherein the first power supply voltage terminal is not a ground voltage terminal.

6. The digitally controlled oscillator of claim 1, wherein the first power supply voltage terminal is a ground voltage terminal.

7. A digitally controlled oscillator comprising:
a ring oscillator having a delay line including a plurality of inverters, wherein each of the inverters is connected between a first delay power supply node and a second delay power supply node;
a first variable resistance bank connected between the first delay power supply node and a first power supply voltage terminal and having a variable resistance value varied under the control of n bits of a control code; and a second variable resistance bank connected between the second delay power supply node and the second power supply voltage terminal and having the resistance value varied under the control of the n bits of the control code, wherein a frequency of a clock signal output by the ring oscillator is based on the resistance value of the first and the second variable resistance banks, wherein the frequency of the clock signal output by the ring oscillator changes substantially proportional to a number of active bits of the control code, wherein the second variable resistance bank is formed of N transistors connected in parallel between the second delay power supply node and the second power supply voltage terminal, and which are sequentially turned ON by corresponding active bits of the control code, wherein a relationship between the number of active bits of the control code and the reciprocal of the resistance value is non-linear.

8. The digitally controlled oscillator of claim 7, wherein while a state of the nth transistor is changed, states of first to the (n-1)th transistors are maintained.

9. A digitally controlled oscillator comprising:
a ring oscillator having a delay line including a plurality of inverters, wherein each of the inverters is connected between a first delay power supply node and a second delay power supply node; and
a first variable resistance bank formed of a plurality of switches each turned ON or OFF according to a corresponding bit of a control code,
wherein an output frequency of the ring oscillator increases linearly according to sequential changes of the states of the plurality of switches,
wherein the output frequency of the ring oscillator decreases linearly when the total resistance value of the first variable resistance bank decreases according to sequential changes of the states of the plurality of switches,
wherein a relationship between a number of active bits of the control code and a reciprocal of the total resistance value is non-linear and wherein a relationship between a reciprocal of the total resistance value and the output frequency is non-linear.

10. A digitally controlled oscillator comprising:
a ring oscillator having a delay line including a plurality of inverters, wherein each of the inverters is connected between a first delay power supply node and a second delay power supply node; and
a first variable resistance bank formed of a plurality of switches each turned ON or OFF according to a corresponding bit of a control code,
wherein an output frequency of the ring oscillator increases linearly according to sequential changes of the states of the plurality of switches,
wherein the output frequency of the ring oscillator decreases linearly when the total resistance value of the first variable resistance bank decreases according to sequential changes of the states of the plurality of switches,
wherein the first variable resistance bank is connected between the first delay power supply node and a first power supply voltage terminal, and
wherein a reciprocal of the total resistance value increases when a number $\Delta CC0$ of active bits of the control code increases and gradually decreases when the number $\Delta CC0$ of active bits of the control code decreases.

11. The digitally controlled oscillator of claim 10, wherein each of the plurality of switches of the first variable resistance bank is formed of a P-type field effect transistor (PFET).

12. A digitally controlled oscillator comprising:
a ring oscillator having a delay line including a plurality of inverters, wherein each of the inverters is connected between a first delay power supply node and a second delay power supply node; and
a first variable resistance bank formed of a plurality of switches each turned ON or OFF according to a corresponding bit of a control code,
wherein an output frequency of the ring oscillator increases linearly according to sequential changes of the states of the plurality of switches,
wherein the output frequency of the ring oscillator decreases linearly when a total resistance value of the first variable resistance bank decreases according to sequential changes of the states of the plurality of switches,
wherein the first variable resistance bank is connected between the second delay power supply node and a ground voltage terminal, and
wherein a reciprocal of the total resistance value gradually decreases when a number $\Delta CC0$ of active bits of the control code increases and gradually increases when the number $\Delta CC0$ of active bits of the control code decreases.

13. The digitally controlled oscillator of claim 12, wherein each of the plurality of switches of the first variable resistance bank is formed of an N-type field effect transistor (NFET).

14. A phase locked loop (PLL) comprising:
a phase detector configured to provide a phase detection value to an encoder;
the encoder configured to generate a phase error value according to the phase detection value;
a loop filter configured to filter the phase error value; and
the digitally controlled oscillator (DCO) of claim 1, configured to generate a clock signal output of the PLL based on the filtered phase error value.

15. The phase locked loop of claim 14, wherein the DCO further includes a control logic circuit for generating the control code.

16. The phase locked loop of claim 14, further comprising a divider configured to divide the clock signal output of the PLL, and configured to output the divided clock signal to the phase detector, wherein the phase detector receives a reference clock signal.

* * * * *